United States Patent
Kim

(10) Patent No.: US 10,347,307 B2
(45) Date of Patent: Jul. 9, 2019

(54) SKEW CONTROL CIRCUIT AND INTERFACE CIRCUIT INCLUDING THE SAME

(71) Applicant: SK hynix Inc., Gyeonggi-do (KR)

(72) Inventor: Jae-Heung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/847,558

(22) Filed: Dec. 19, 2017

(65) Prior Publication Data

US 2019/0005994 A1 Jan. 3, 2019

Related U.S. Application Data

(60) Provisional application No. 62/526,716, filed on Jun. 29, 2017.

(51) Int. Cl.
 *G11C 7/22* (2006.01)
 *G11C 7/10* (2006.01)
(52) U.S. Cl.
 CPC ........... *G11C 7/22* (2013.01); *G11C 7/106* (2013.01); *G11C 7/1057* (2013.01); *G11C 7/1066* (2013.01); *G11C 7/1084* (2013.01); *G11C 7/1087* (2013.01); *G11C 7/1093* (2013.01)
(58) Field of Classification Search
 CPC .................................. G11C 7/22; G11C 8/10
 USPC ........................................ 365/189.05, 230.06
 See application file for complete search history.

(56) References Cited

U.S. PATENT DOCUMENTS

| | | | | |
|---|---|---|---|---|
| 5,905,391 A | * | 5/1999 | Mooney | G06F 1/10 327/161 |
| 6,265,904 B1 | * | 7/2001 | Killorn | H03D 13/003 327/12 |
| 6,646,953 B1 | * | 11/2003 | Stark | G06F 13/4217 365/189.12 |
| 6,704,881 B1 | * | 3/2004 | Li | G06F 1/10 713/400 |
| 7,046,052 B1 | * | 5/2006 | Percey | H03K 23/50 327/115 |
| 7,408,393 B1 | * | 8/2008 | Jain | H03K 3/0372 327/202 |
| 8,565,034 B1 | | 10/2013 | Lu et al. | |
| 9,147,463 B1 | * | 9/2015 | Sarraju | G11C 11/4076 |
| 2001/0009385 A1 | * | 7/2001 | Lai | G06F 1/10 327/158 |
| 2002/0091958 A1 | * | 7/2002 | Schoenfeld | G06F 1/10 713/401 |

(Continued)

FOREIGN PATENT DOCUMENTS

KR 1020140041207 4/2014

*Primary Examiner* — Michael T Tran
(74) *Attorney, Agent, or Firm* — IP & T Group LLP

(57) ABSTRACT

A data interface circuit includes a first latch corresponding to a first data signal, and suitable for outputting first data based on toggling of a data strobe signal; a second latch corresponding to a second data signal, and suitable for outputting second data based on toggling of the data strobe signal; and a skew control circuit suitable for delaying the first data signal by a predetermined time, applying the delayed first data signal to the first latch, controlling the delayed first data signal based on a result of comparing the first data signal and the second data signal, and applying the controlled delayed first data signal to the second latch.

14 Claims, 6 Drawing Sheets

(56) References Cited

U.S. PATENT DOCUMENTS

| | | | |
|---|---|---|---|
| 2003/0043926 A1* | 3/2003 | Terashima | H04L 7/0012 375/257 |
| 2004/0202253 A1* | 10/2004 | Hanibuchi | H04L 7/0008 375/257 |
| 2005/0047192 A1* | 3/2005 | Matsui | G06F 13/1689 365/145 |
| 2005/0047246 A1* | 3/2005 | Kyung | G11C 7/1051 365/222 |
| 2005/0138458 A1* | 6/2005 | Smith | G06F 1/12 713/600 |
| 2006/0117231 A1* | 6/2006 | Hoffman | G11C 7/22 714/718 |
| 2006/0193413 A1* | 8/2006 | Shandilya | H03K 5/135 375/355 |
| 2006/0242448 A1* | 10/2006 | Minzoni | G06F 1/10 713/503 |
| 2007/0242531 A1* | 10/2007 | Ku | G11C 7/1039 365/189.05 |
| 2007/0253262 A1* | 11/2007 | Oh | G11C 7/1027 365/193 |
| 2007/0291557 A1* | 12/2007 | Nishio | G11C 5/02 365/193 |
| 2008/0031079 A1* | 2/2008 | Osawa | G11C 7/1066 365/233.1 |
| 2009/0067268 A1* | 3/2009 | Seo | G11C 7/1051 365/193 |
| 2009/0109770 A1* | 4/2009 | Sugishita | G06F 13/1689 365/193 |
| 2009/0147888 A1* | 6/2009 | Felix | H04L 7/0008 375/340 |
| 2010/0271092 A1* | 10/2010 | Zerbe | G06F 13/4243 327/161 |
| 2011/0121814 A1* | 5/2011 | Uematsu | G01R 31/31725 324/76.11 |
| 2011/0291719 A1* | 12/2011 | Ok | H03L 7/0805 327/158 |
| 2011/0292739 A1* | 12/2011 | Song | G11C 7/1006 365/189.05 |
| 2012/0163101 A1* | 6/2012 | Kato | G11C 7/02 365/189.06 |
| 2012/0257463 A1* | 10/2012 | Jain | G11C 7/00 365/189.11 |
| 2012/0269008 A1* | 10/2012 | Huang | G11C 7/02 365/189.05 |
| 2014/0145756 A1* | 5/2014 | Chong | H03K 19/177 326/40 |
| 2014/0208147 A1* | 7/2014 | Canac | G06F 13/4217 713/401 |
| 2014/0208178 A1* | 7/2014 | Sunter | G01R 31/3177 714/731 |
| 2015/0162070 A1* | 6/2015 | Sato | G11C 11/4076 365/193 |
| 2015/0221354 A1* | 8/2015 | Palmer | G06F 13/1689 365/193 |
| 2015/0358007 A1* | 12/2015 | Diffenderfer | H03K 5/13 327/241 |
| 2016/0035409 A1* | 2/2016 | Gopalan | G11C 11/4076 365/193 |
| 2016/0035411 A1* | 2/2016 | Yu | G11C 11/4091 365/189.07 |

* cited by examiner

SKEW CONTROL CIRCUIT AND INTERFACE CIRCUIT INCLUDING THE SAME

CROSS-REFERENCE TO RELATED APPLICATION

This application claims priority under to U.S. Provisional Patent Application No. 62/526,716 entitled, "DE-SKEWING METHOD FOR tDS/H IMPROVEMENT", filed on Jun. 29, 2017, which is incorporated herein by reference in its entirety.

TECHNICAL FIELD

Exemplary embodiments of the present disclosure relate to a skew control circuit and an interface circuit including the skew control circuit.

DISCUSSION OF THE RELATED ART

Electronic devices such as computers, mobile phones, and storage devices may include integrated circuits (ICs) in which various elements or circuits are integrated. Each integrated circuit may be coupled to at least one external circuit or device, and may include a component for interfacing such an external circuit or device. For example, a peripheral device such as a memory device may be coupled to a memory controller to configure a memory system. In general, in the memory system, various signals such as data, an address, and a command may be transmitted and received between the memory device and the memory controller.

In a memory system, a mismatch (or a skew) may occur between a data path and a clock path. In particular, in a memory system for a high speed operation, such as a double data rate 5 (DDR5) dynamic random access memory (DRAM), a skew may occur between a data signal and a data strobe signal. In the case where such a skew goes beyond an allowable range, an error may occur when transmitting and receiving data. Accordingly, as a read operation or a write operation for data is performed erroneously, the performance of the memory system may deteriorate.

SUMMARY

Various embodiments are directed to a circuit for eliminating a skew between a data signal and a data strobe signal in a memory system.

In an embodiment, a data interface circuit may include: a first latch corresponding to a first data signal, and suitable for outputting first data based on toggling of a data strobe signal; a second latch corresponding to a second data signal, and suitable for outputting second data based on toggling of the data strobe signal; and a skew control circuit suitable for delaying the first data signal by a predetermined time, applying the delayed first data signal to the first latch, controlling the delayed first data signal based on a result of comparing the first data signal and the second data signal, and applying the controlled delayed first data signal to the second latch.

In an embodiment, a data interface circuit may include: a first latch corresponding to a first data signal, and suitable for outputting first data based on toggling of a data strobe signal; a second latch corresponding to a second data signal, and suitable for outputting second data based on toggling of the data strobe signal; a third latch corresponding to a third data signal, and suitable for outputting third data based on toggling of the data strobe signal; a fourth latch corresponding to a fourth data signal, and suitable for outputting fourth data based on toggling of the data strobe signal; and a skew control circuit suitable for delaying the first data signal by a predetermined time, applying the delayed first data signal to the first latch, controlling the delayed first data signal based on a result of comparing the first data signal and the second data signal, and applying the controlled delayed first data signal to the second latch, the third latch and the fourth latch.

DETAILED DESCRIPTION

Figure 1A:
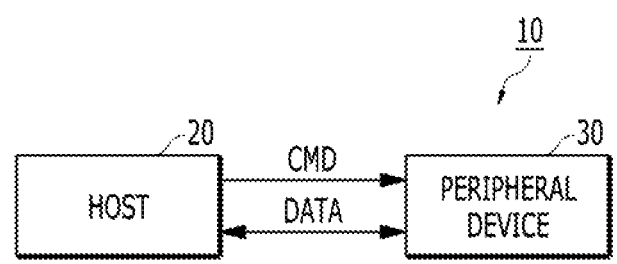
FIGS. 1A and 1B are diagrams illustrating data processing systems.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

Figure 1B:
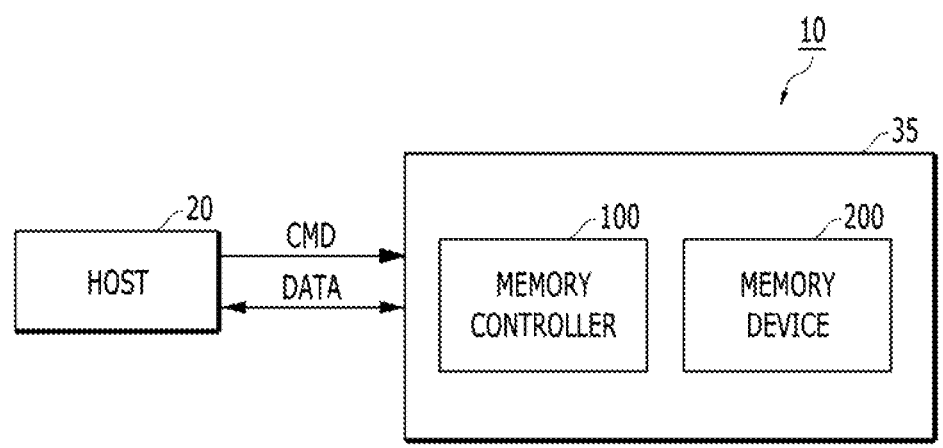

FIGS. 1A and 1B are diagrams illustrating data processing system 10.

Referring to FIG. 1A, the data processing system 10 may include a host 20 and a peripheral device 30. The peripheral device 30 receives a command CMD (or a request) from the host 20, and exchanges data DATA with the host 20 depending on the received command CMD. For example, the host 20 may be a computer, a server, a smart phone, etc., and the peripheral device 30 may be a mobile or storage product.

Referring to FIG. 1B, the peripheral device 30 shown in FIG. 1A may be embodied by a memory system 35. That is to say, a data processing system 10 may include a host 20 and the memory system 35. The host 20 may include portable electronic devices such as mobile phones, MP3 players, and a laptop computers, or electronic devices such as desktop computers, gaming consoles, TVs, and projectors.

The memory system 35 may be accessed in response to a command CMD from the host 20. In other words, the memory system 35 may be used as a main memory device or an auxiliary memory device of the host 20.

The memory system 35 may include a memory controller 100 and a memory device 200. The memory controller 100 may perform an access operation for the corresponding memory device 200, in response to the command CMD from the host 20. For example, the memory controller 100 stores write data from the host 20, in the memory device 200, in response to a write command from the host 20. For another example, the memory controller 100 reads the data stored in the memory device 200 and transfers the read data to the host 20, in response to a read command from the host 20. In various embodiments, the memory device 200 may be a volatile memory device such as a dynamic random access memory (DRAM) or an static RAM (SRAM). In other embodiments, the memory device 200 may be a nonvolatile memory device such as a read only memory (ROM), a mask ROM (MROM), a programmable ROM (PROM), an electrically programmable ROM (EPROM), an electrically erasable programmable ROM (EEPROM), an ferroelectric RAM (FRAM), a phase change RAM (PRAM), a magnetic RAM (MRAM), a resistive RAM (RRAM), or a flash memory.

Figure 2:
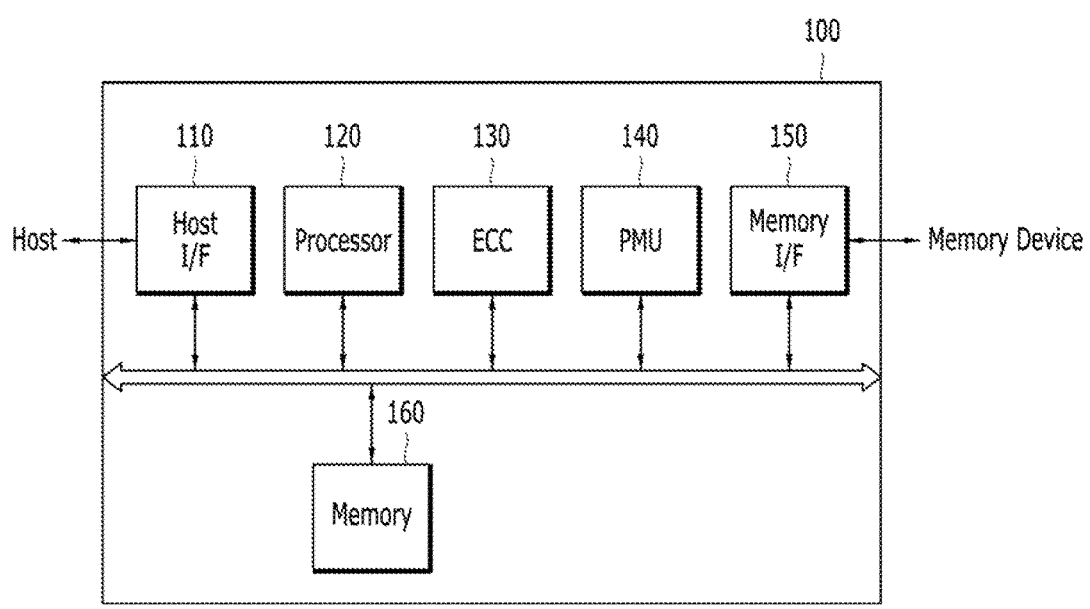
FIG. 2 is a diagram illustrating a memory controller.

FIG. 2 is a diagram illustrating a memory controller. For example, FIG. 2 is a diagram showing the configuration of the memory controller 100 shown in FIG. 1B.

Referring to FIG. 2, the memory controller 100 may include a host interface circuit 110, a processor 120, an error correction code (ECC) circuit 130, a power management unit (PMU) 140, a memory interface circuit 150, and a memory 160.

The host interface circuit 110 may process a command and data received from the host 20. The host interface circuit 110 may be configured such that memory controller 100 communicates with the host 20 through at least one among various interface protocols.

The ECC circuit 130 may detect and correct an error included in the data read from a memory device, for example, the memory device 200 shown in FIG. 1B.

The PMU 140 may provide power to the components included in the memory controller 100, and may manage the power provided to them.

The memory interface circuit 150 may perform interfacing between the memory controller 100 and the memory device 200. The memory interface circuit 150 may be NAND Flash Controller (NFC). In detail, the memory interface circuit 150 may process a command and data between the memory controller 100 and the memory device 200 under the control of the processor 120. For example, the memory interface circuit 150 may transfer write data from the host 20 to the memory device 200 in response to a write command from the host 20 such that the corresponding data is stored in the memory device 200. For another example, the memory interface circuit 150 may receive the data read from the memory device 200 in response to a read command from the host 20 such that the read data is transferred to the host 20.

The memory 160 may function as the working memory of the memory system 35 and the memory controller 100 may store the data related with the operations of the memory system 35 and the memory controller 100. For example, the memory 160 may store program data necessary for a data write operation and/or a data read operation between the host 20 and the memory device 200, and may store write data and/or read data. Such a memory 160 may be embodied as a volatile memory such as a static random access memory (SRAM) or a dynamic random access memory (DRAM).

The processor 120 may control general operations of the memory system 35. For example, the processor 20 may control a write operation and/or a read operation for the memory device 200 in response to a write request or a read request from the host 20.

Figure 3:
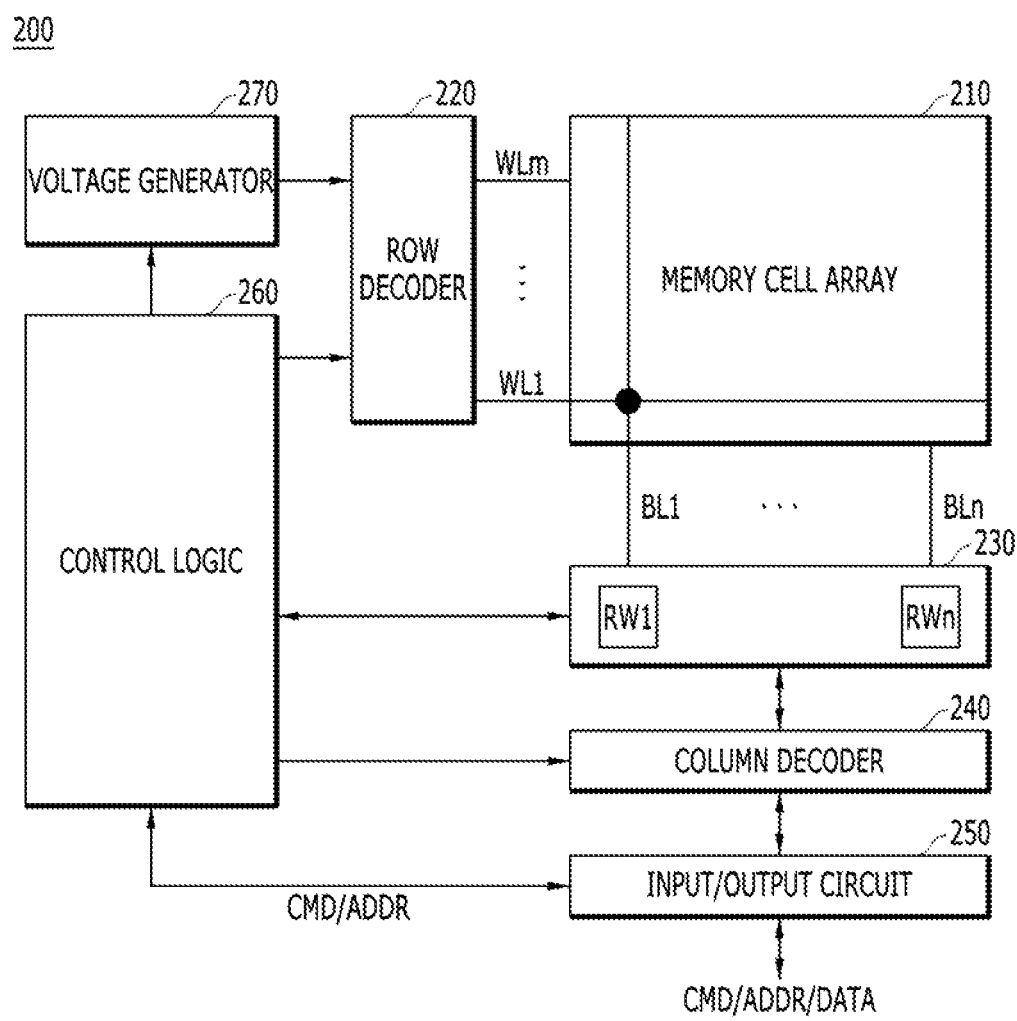
FIG. 3 is a diagram illustrating a memory device.

FIG. 3 is a diagram illustrating a memory device. For example, FIG. 3 is a diagram showing the configuration of a nonvolatile memory device which may be the memory device 200 shown in FIG. 1B.

Referring to FIG. 3, the memory device 200 may include a memory cell array 210, a row decoder 220, a data read/write block 230, a column decoder 240, an input/output circuit 250, a control logic 260, and a voltage generator 270.

The memory cell array 210 may include memory cells (MC), which are arranged at areas where word lines WL1 to WLm and bit lines BL1 to BLn intersect with each other.

The row decoder 220 may be coupled to the memory cell array 210 through the word lines WL1 to WLm. The row decoder 220 may operate under the control of the control logic 260. The row decoder 220 may decode an address provided from an external device (for example, the memory controller 100 of FIG. 1B). The row decoder 220 may select and drive the word lines WL1 to WLm, based on a decoding result. For instance, the row decoder 220 may provide a word line voltage provided from the voltage generator 270, to the word lines WL1 to WLm.

The data read/write block 230 may be coupled to the memory cell array 210 through the bit lines BL1 to BLn. The data read/write block 230 may include read/write circuits RW1 to RWn corresponding to the bit lines BL1 to BLn, respectively. The data read/write block 230 may operate under the control of the control logic 260. The data read/write block 230 may operate as a write driver or a sense amplifier depending on an operation mode. For example, the data read/write block 230 may operate as a write driver that stores data provided from the external device, in the memory cell array 210, in a write operation. For another example, the data read/write block 230 may operate as a sense amplifier that reads out data from the memory cell array 210, in a read operation.

The column decoder 240 may operate under the control of the control logic 260. The column decoder 240 may decode an address provided from the external device. The column decoder 240 may couple the read/write circuits RW1 to RWn of the data read/write block 230 corresponding to the bit lines BL1 to BLn, respectively, and the data input/output lines of the input/output circuit 250, based on a decoding result.

The voltage generator 270 may generate voltages to be used in the internal operations of the memory device 200. The voltages generated by the voltage generator 270 may be applied to the memory cells of the memory cell array 210. For example, a program voltage generated in a write operation may be applied to a word line of memory cells for which the write operation is to be performed. For another example, an erase voltage generated in an erase operation may be applied to a well-region of memory cells for which the erase operation is to be performed. For still another example, a read voltage generated in a read operation may be applied to a word line of memory cells for which the read operation is to be performed.

The control logic 260 may control general operations of the memory device 200, based on the signals provided through the input/output circuit 250 from the external device. For example, the control logic 260 may control the read, write, and erase operations of the memory device 200.

The input/output circuit 250 may transfer a command CMD and an address ADDR received from the external device, to the control logic 260, or may exchange data DATA with the column decoder 240. Further, the input/output circuit 250 may be coupled to the column decoder 240, and may output the read data sensed by the data read/write block 230, to the external device through input/output lines (not shown). Moreover, the input/output circuit 250 may transfer the data received through the input/output lines, to the data read/write block 230 through the column decoder 240.

Figure 4:
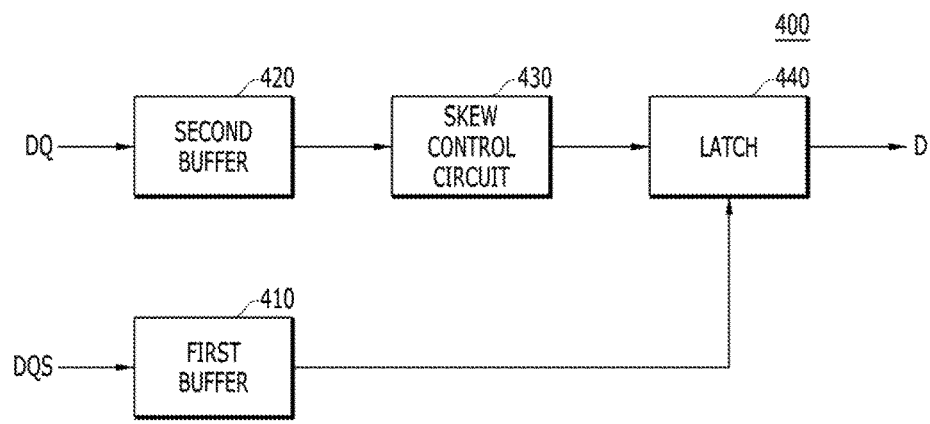
FIG. 4 is a block diagram illustrating a configuration of a data interface circuit.

FIG. 4 is a diagram illustrating a configuration of a data interface circuit 400 in accordance with an embodiment of the present disclosure. For example, the data interface circuit 400 may be a component included in the memory interface circuit 150 of the memory controller 100 shown in FIG. 2 or may be a component included in the input/output circuit 250 of the memory device 200 shown in FIG. 3. Namely, the data interface circuit 400 may be included in the memory interface circuit 150 of the memory controller 100, which receives the data read from the memory device 200, or may be included in the input/output circuit 250 of the memory device 200, which receives data to be written in the memory cell array 210 of the memory device 200 from the memory controller 100.

Referring to FIG. 4, the data interface circuit 400 may include a first buffer 410, a second buffer 420, a skew control circuit 430, and a latch 440. The first buffer 410 may receive and buffer a data strobe signal DQS. The second buffer 420 may receive and buffer a data signal DQ. The latch 440 may latch the data signal buffered by the second buffer 420 in response to the toggling of the data strobe signal buffered by the first buffer 410, and may output latched data D.

The skew control circuit 430 may be coupled between the second buffer 420 and the latch 440. The skew control circuit 430 may delay the buffered data signal, and may output a delayed buffered data signal to the latch 440. The skew control circuit 430 may delay the buffered data signal such that the edge of the data strobe signal DQS is positioned at the center portion of the window of the buffered data signal. Since the setup time and the hold time of the data signal may be made the same through such delay processing, the skew control circuit 430 may control and eliminate the skew between the data signal and the data strobe signal.

Figure 5:
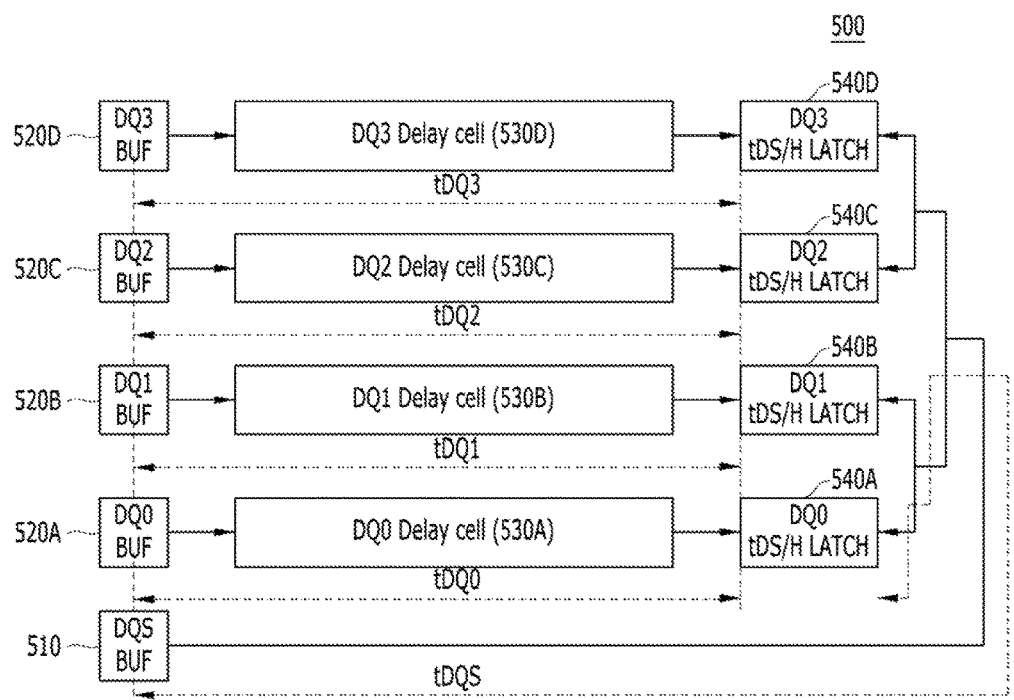
FIG. 5 is a diagram illustrating a data interface circuit.

FIG. 5 is a diagram illustrating a data interface circuit 500.

Referring to FIG. 5, the data interface circuit 500 may include a buffer 510 for buffering a data strobe signal DQS, buffers 520A to 520D for buffering data signals DQ0 to DQ3, respectively, and latches 540A to 540D corresponding to the data signals DQ0 to DQ3, respectively, and for outputting data signals eliminated with skews. The data interface circuit 500 may further include delay cells 530A to 530D, which are coupled between the buffers 520A to 520D and the latches 540A to 540D, respectively.

The data interface circuit 500 uses a DQS clock tree structure for matching of a setup time and a hold time, and causes physical matching to be implemented among the data signals DQ0 to DQ3. That is, in order for tDS/H matching, the data interface circuit 500 includes the delay cells 530A to 530D as shown to ensure tDQS=tDQ0=tDQ1=tDQ2=tDQ3. Here, tDQS represents a time between the DQS buffer 510 and the latches 540A to 540D, tDQ0 represents a time between the DQ0 buffer 520A and the DQ0 latch 540A, tDQ1 represents a time between the DQ1 buffer 520B and the DQ1 latch 540B, tDQ2 represents a time between the DQ2 buffer 520C and the DQ2 latch 540C, and tDQ3 represents a time between the DQ3 buffer 520D and the DQ3 latch 540D.

Figure 6:
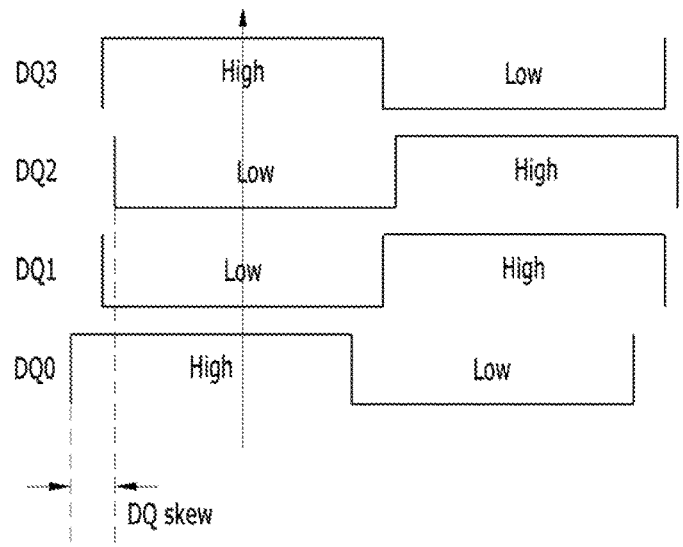
FIG. 6 is a diagram illustrating operation timings of the data interface circuit shown in FIG. 5.

FIG. 6 is a diagram illustrating operation timings of the data interface circuit 500 shown in FIG. 5.

Referring to FIG. 6, the data interface circuit 500 may output the data signals DQ0 to DQ3 such that the edge of the data strobe signal DQS is positioned at the center portion of the window of a data signal.

However, in the data interface circuit 500 shown in FIG. 5, since the DQS clock tree structure may be too long, a large number of DQ delay cells are required to compensate for the DQS clock tree structure. In addition, even when the layout between DQs is made the same, because it is impossible to realize an ideal delay due to coupling or the like, a skew may occur between DQs. Therefore, implementation of an improved skew circuit is required.

Figure 7:
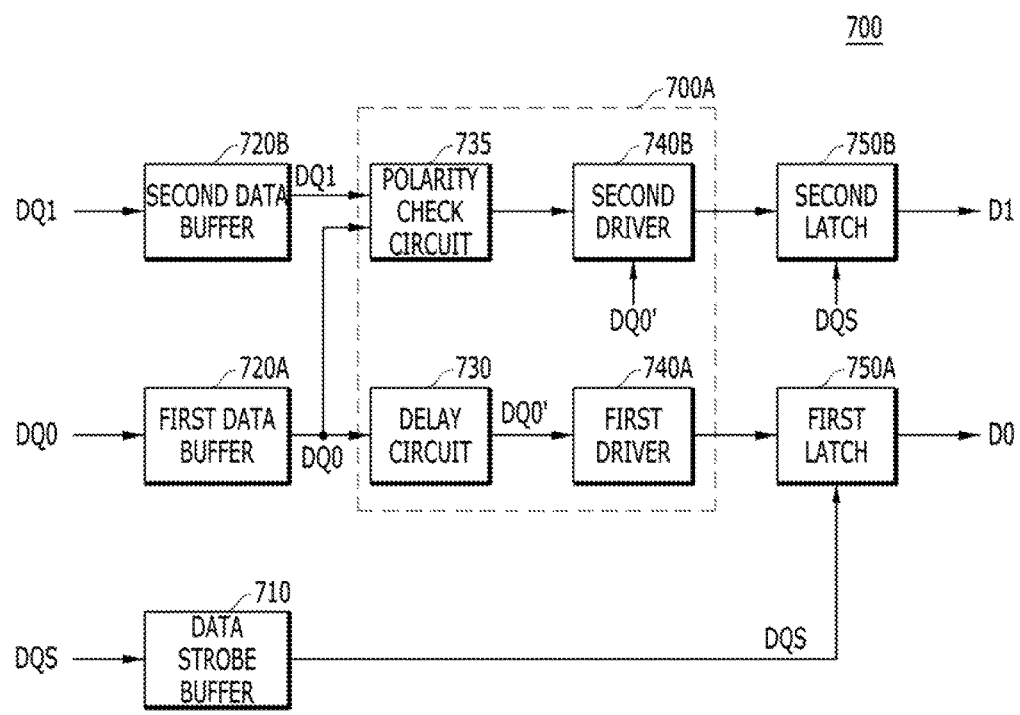
FIG. 7 is a diagram illustrating a configuration of a data interface circuit in accordance with an embodiment of the present disclosure.

FIG. 7 is a diagram illustrating a configuration of a data interface circuit 700 in accordance with an embodiment of the present disclosure.

Referring to FIG. 7, the data interface circuit 700 may include a data strobe buffer 710, a first data buffer 720A, a second data buffer 720B, a first latch 750A, and a second latch 750B. The data interface circuit 700 may further include a skew control circuit 700A, which is coupled between the first data buffer 720A and the first latch 750A, and between the second data buffer 720B and the second latch 750B.

The data strobe buffer 710 may buffer a data strobe signal DQS, and may apply a buffered data strobe signal to the first latch 750A. The first data buffer 720A may buffer a first data signal DQ0, and may apply a buffered first data signal to the skew control circuit 700A. The second data buffer 720B may buffer a second data signal DQ1, and may apply a buffered second data signal to the skew control circuit 700A. In various embodiments, the first data buffer 720A may be positioned at a shortest distance from the data strobe buffer 710, and the second data buffer 720B may be positioned next.

The first latch 750A may correspond to the first data signal DQ0, and may output first data D0 responding to the toggling of the data strobe signal DQS. The second latch 750B may correspond to the second data signal DQ1, and may output second data D1 responding to the toggling of the data strobe signal DQS. The first data D0 may be a data signal in which the edge of the data strobe signal DQS is positioned at the center portion of the window of the first data signal DQ0, due to the processing of the skew control circuit 700A. The second data D1 may be a data signal in which the edge of the data strobe signal DQS is positioned at the center portion of the window of the second data signal DQ1, due to the processing of the skew control circuit 700A.

In an embodiment, the first data signal DQ0 and the second data signal DQ1 may be the data read from the memory cell array of a memory device, and the first data D0 and the second data D1 may be data to be transmitted to a memory controller. In another embodiment, the first data signal DQ0 and the second data signal DQ1 may be the write data received from a memory controller, and the first data D0 and the second data D1 may be data to be written in a memory device.

The skew control circuit 700A may delay the first data signal DQ0 by a predetermined time, and may apply a delayed data signal DQ0' to the first latch 750A. To this end, the skew control circuit 700A may include a delay circuit 730 and a first driver 740A. The delay circuit 730 may delay the first data signal DQ0 by the predetermined time such that the edge of the data strobe signal DQS is positioned at the center portion of the window of the first data signal DQ0, and may output the delayed data signal DQ0'. The first driver 740A may drive the first latch 750A according to the delayed data signal DQ0'.

Also, the skew control circuit 700A may control the delayed data signal DQ0' based on a result of comparing the first data signal DQ0 and the second data signal DQ1, and may apply a controlled delayed data signal to the second latch 750B. To this end, the skew control circuit 700A may include a polarity check circuit 735 and a second driver 740B. The polarity check circuit 735 may check the polarity of the second data signal DQ1 in comparison with the first data signal DQ0, and may output a check result. The second driver 740B may modify the delayed data signal DQ0' depending on the check result by the polarity check circuit 735, and may drive the second latch 750B according to a modified control signal.

Figure 8:
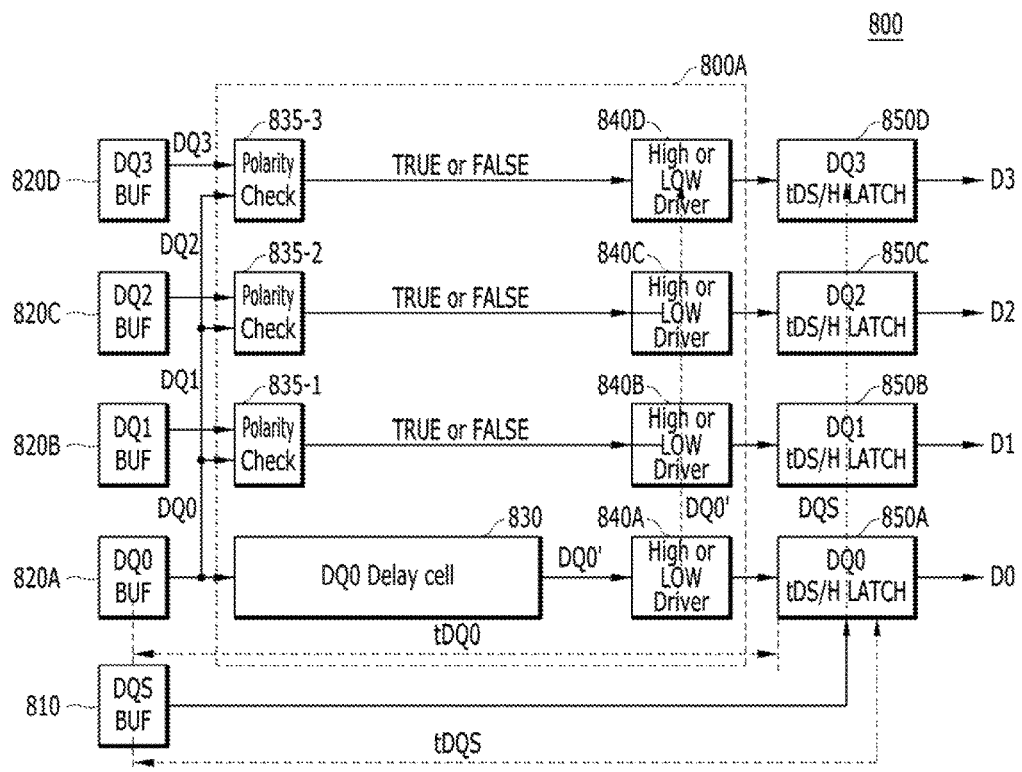
FIG. 8 is a diagram illustrating a configuration of a data interface circuit in accordance with another embodiment of the present disclosure.

FIG. 8 is a diagram illustrating a configuration of a data interface circuit 800 in accordance with another embodiment of the present disclosure.

Referring to FIG. 8, the data interface circuit 800 may include a data strobe buffer 810, a first data buffer 820A, a second data buffer 820B, a third data buffer 820C, a forth data buffer 820D, a first latch 850A, a second latch 850B, a third latch 850C and a fourth latch 850D. The data interface circuit 800 may further include a skew control circuit 800A, which is coupled between the first data buffer 820A and the first latch 850A, between the second data buffer 820B and the second latch 850B, between the third data buffer 820C and the third latch 850C, and between the fourth data buffer 820D and the fourth latch 850D.

The data strobe buffer 810 may buffer a data strobe signal DQS, and may apply a buffered data strobe signal to the first latch 850A. The first data buffer 820A may buffer a first data signal DQ0, and may apply a buffered first data signal to the skew control circuit 800A. The second data buffer 820B may buffer a second data signal DQ1, and may apply a buffered second data signal to the skew control circuit 800A. The third data buffer 820C may buffer a third data signal DQ2, and may apply a buffered third data signal to the skew control circuit 800A. The fourth data buffer 820D may buffer a fourth data signal DQ3, and may apply a buffered fourth data signal to the skew control circuit 800A. In various embodiments, the first data buffer 820A may be positioned at a shortest distance from the data strobe buffer 810, the second data buffer 820B may be positioned next, the third data buffer 820C may be positioned next, and the fourth data buffer 820D may be positioned next.

The first latch 850A may correspond to the first data signal DQ0, and may output first data D0 responding to the toggling of the data strobe signal DQS. The second latch 850B may correspond to the second data signal DQ1, and may output second data D1 responding to the toggling of the data strobe signal DQS. The third latch 850C may correspond to the third data signal DQ2, and may output third data D2 responding to the toggling of the data strobe signal DQS. The fourth latch 850D may correspond to the fourth data signal DQ3, and may output fourth data D3 responding to the toggling of the data strobe signal DQS.

The first data D0 may be a data signal in which the edge of the data strobe signal DQS is positioned at the center portion of the window of the first data signal DQ0, due to the processing of the skew control circuit 800A. The second data D1 may be a data signal in which the edge of the data strobe signal DQS is positioned at the center portion of the window of the second data signal DQ1, due to the processing of the skew control circuit 800A. The third data D2 may be a data signal in which the edge of the data strobe signal DQS is positioned at the center portion of the window of the third data signal DQ2, due to the processing of the skew control circuit 800A. The fourth data D3 may be a data signal in which the edge of the data strobe signal DQS is positioned at the center portion of the window of the fourth data signal DQ3, due to the processing of the skew control circuit 800A.

In an embodiment, the first data signal DQ0 to the fourth data signal DQ3 may be the data read from the memory cell array of a memory device, and the first data D0 to the fourth data D3 may be data to be transmitted to a memory controller. In another embodiment, the first data signal DQ0 to the fourth data signal DQ3 may be the write data received from a memory controller, and the first data D0 to the fourth data D3 may be data to be written in a memory device.

The skew control circuit 800A may delay the first data signal DQ0 by a predetermined time, and may apply a delayed data signal DQ0' to the first latch 850A. To this end, the skew control circuit 800A may include a delay circuit 830 and a driver 840A. The delay circuit 830 which may be embodied by a delay cell may delay the first data signal DQ0 by the predetermined time such that the edge of the data strobe signal DQS is positioned at the center portion of the window of the first data signal DQ0, and may output the delayed data signal DQ0'. The driver 840A may drive the first latch 850A according to the delayed data signal DQ0'.

Also, the skew control circuit 800A may control the delayed data signal DQ0' based on a result of comparing the first data signal DQ0 and the second data signal DQ1, and may apply a controlled delayed data signal to the second latch 850B, the third latch 850C, and the fourth latch 850D. To this end, the skew control circuit 800A may include polarity check circuits 835-1 to 835-3 and drivers 840B to 840D.

The polarity check circuit 835-1 may check the polarity of the second data signal DQ1 in comparison with the first data signal DQ0, and may output a corresponding check result. For example, the polarity check circuit 835-1 may output a "true" value in the case where the level of the second data signal DQ1 is the same as the first data signal DQ0, and may output a "false" value otherwise. The driver 840B may receive the delayed data signal DQ0' outputted from the delay circuit 830, may modify the delayed data signal DQ0' depending on the check result by the corresponding polarity check circuit 835-1, and may drive the second latch 850B according to a modified control signal. For example, the driver 840B may drive the second latch 850B according to the delayed data signal DQ0' in the case where the check result by the polarity check circuit 835-1 is "high," and may invert the delayed data signal DQ0' and drive the second latch 850B according to an inverting result in the case where the check result by the polarity check circuit 835-1 is "low."

The polarity check circuit 835-2 may check the polarity of the third data signal DQ2 in comparison with the first data signal DQ0, and may output a corresponding check result. For example, the polarity check circuit 835-2 may output the "true" value in the case where the level of the third data signal DQ2 is the same as the first data signal DQ0, and may output the "false" value otherwise. The driver 840C may receive the delayed data signal DQ0' outputted from the delay circuit 830, may modify the delayed data signal DQ0' depending on the check result by the corresponding polarity check circuit 835-2, and may drive the third latch 850C according to a modified control signal. For example, the driver 840C may drive the third latch 850C according to the delayed data signal DQ0' in the case where the check result by the polarity check circuit 835-2 is "high," and may invert the delayed data signal DQ0' and drive the third latch 850C according to an inverting result in the case where the check result by the polarity check circuit 835-2 is "low."

The polarity check circuit 835-3 may check the polarity of the fourth data signal DQ3 in comparison with the first data signal DQ0, and may output a corresponding check result. For example, the polarity check circuit 835-3 may output the "true" value in the case where the level of the fourth data signal DQ3 is the same as the first data signal DQ0, and may output the "false" value otherwise. The driver 840D may receive the delayed data signal DQ0' outputted from the delay circuit 830, may modify the delayed data signal DQ0' depending on the check result by the corresponding polarity check circuit 835-3, and may drive the fourth latch 850D according to a modified control signal. For example, the driver 840D may drive the fourth latch 850D according to the delayed data signal DQ0' in the case where the check result by the polarity check circuit 835-3 is "high," and may invert the delayed data signal DQ0' and drive the fourth latch 850D according to an inverting result in the case where the check result by the polarity check circuit 835-3 is "low."

In this way, the data interface circuit 800 performs a process to eliminate a skew between the data strobe signal DQS and the first data signal DQ0, and then performs a process to eliminate skews for the other data signals by using signals according to a processing result. In other words, the data interface circuit 800 matches a setup time and a hold time tDS/H between the DQ0 signal and the DQS signal, and transfers the DQ0' signal and the DQS signal sequentially to drivers and latches for the DQ1, DQ2 and DQ3 signals through the same paths. The drivers for the DQ1, DQ2 and DQ3 signals drive the corresponding latches by using signals of "high/low" levels according to results of comparing the DQ0 signal and the respective DQ1, DQ2 and DQ3 signals and the DQ0' signal. Such a skew elimination scheme of the data interface circuit 800 may minimize a DQS clock tree structure when compared to the circuit shown in FIG. 5, and, because all the drivers drive the corresponding latches based on the same DQ0' and DQS signals, skews between DQs may be minimized.

Figure 9:
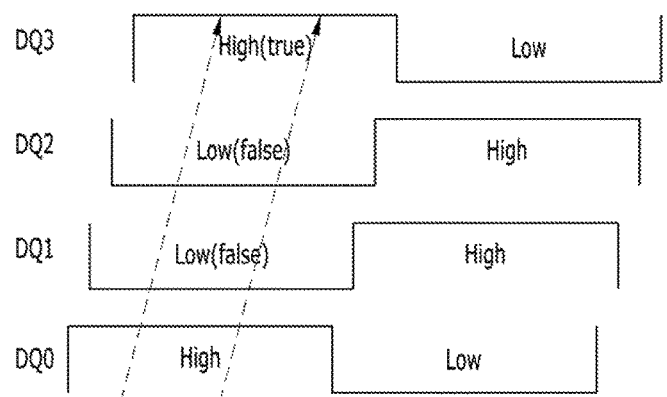
FIG. 9 is a diagram illustrating operation timings of the data interface circuit shown in FIG. 8.

FIG. 9 is a diagram illustrating operation timings of the data interface circuit 800 shown in FIG. 8.

Referring to FIG. 9, the data interface circuit 800 matches the setup time and the hold time tDS/H between the DQ0 signal and the DQS signal, and transfers the DQ0' signal and the DQS signal to be used when processing the DQ1, DQ2 and DQ3 signals. As the driver 840B drives the latch 850B in response to a comparison result between the DQ1 signal and the DQ0 signal and the reception of the DQ0' signal, a signal substantially the same as the DQ1 signal, which is eliminated with a skew, may be latched by the latch 850B. As the driver 840C drives the latch 850C in response to a comparison result between the DQ2 signal and the DQ0 signal and the reception of the DQ0' signal, a signal substantially the same as the DQ2 signal, which is eliminated with a skew, may be latched by the latch 850C. As the driver 840D drives the latch 850D in response to a comparison result between the DQ3 signal and the DQ0 signal and the reception of the DQ0' signal, a signal substantially the same as the DQ3 signal, which is eliminated with a skew, may be latched by the latch 850D.

As is apparent from the above descriptions, a data interface circuit performs a process to eliminate a skew between a data strobe signal (DQS) and any one data signal and then performs a process to eliminate skews for the other data signals by using signals according to a processing result. Such a skew elimination scheme may minimize a DQS clock tree structure and may also minimize skews between DQs.

Although various embodiments have been described for illustrative purposes, it will be apparent to those skilled in the art that various changes and modifications may be made without departing from the spirit and scope of the invention as defined in the following claims.

What is claimed is:

1. A data interface circuit comprising:
   a first latch corresponding to a first data signal, and suitable for outputting first data based on toggling of a data strobe signal;
   a second latch corresponding to a second data signal, and suitable for outputting second data based on toggling of the data strobe signal; and
   a skew control circuit suitable for delaying the first data signal by a predetermined time, applying the delayed first data signal to the first latch, controlling the delayed first data signal based on a result of comparing the first data signal and the second data signal, and applying the controlled delayed first data signal to the second latch.

2. The data interface circuit according to claim 1, wherein the skew control circuit comprises:
   a delay circuit suitable for delaying the first data signal by the predetermined time such that an edge of the data strobe signal is positioned at a center portion of a window of the first data signal, and outputting the delayed first data signal; and
   a first driver suitable for driving the first latch according to the delayed first data signal.

3. The data interface circuit according to claim 2, wherein the skew control circuit further comprises:
   a polarity check circuit suitable for checking a polarity of the second data signal in comparison with the first data signal, and outputting a check result; and
   a second driver suitable for modifying the delayed first data signal according to the check result, and driving the second latch according to the modified delayed first data signal as the controlled delayed first data signal.

4. The data interface circuit according to claim 1, further comprising:
   a first data buffer suitable for buffering the first data signal, and applying the buffered first data signal to the skew control circuit;

a second data buffer suitable for buffering the second data signal, and applying the buffered second data signal to the skew control circuit; and a data strobe buffer suitable for buffering the data strobe signal, and applying the buffered data strobe signal to the first latch.

5. The data interface circuit according to claim 4, wherein the first data buffer is positioned at a shortest distance from the data strobe buffer.

6. The data interface circuit according to claim 4,
wherein the first data signal and the second data signal include data read from a memory cell array, and
wherein the first data and the second data include data to be transmitted to a memory controller.

7. The data interface circuit according to claim 4,
wherein the first data signal and the second data signal include data received from a memory controller, and
wherein the first data and the second data include data to be written in a memory device.

8. A data interface circuit comprising:
a first latch corresponding to a first data signal, and suitable for outputting first data based on toggling of a data strobe signal;
a second latch corresponding to a second data signal, and suitable for outputting second data based on toggling of the data strobe signal;
a third latch corresponding to a third data signal, and suitable for outputting third data based on toggling of the data strobe signal;
a fourth latch corresponding to a fourth data signal, and suitable for outputting fourth data based on toggling of the data strobe signal; and
a skew control circuit suitable for delaying the first data signal by a predetermined time, applying the delayed first data signal to the first latch, controlling the delayed first data signal based on a result of comparing the first data signal and the second data signal, and applying the controlled delayed first data signal to the second latch, the third latch and the fourth latch.

9. The data interface circuit according to claim 8, wherein the skew control circuit comprises:
a delay circuit suitable for delaying the first data signal by the predetermined time such that an edge of the data strobe signal is positioned at a center portion of a window of the first data signal, and outputting the delayed first data signal; and
a first driver suitable for driving the first latch according to the delayed first data signal.

10. The data interface circuit according to claim 9, wherein the skew control circuit further comprises:
polarity check circuits suitable for checking polarities of the second data signal, the third data signal and the fourth data signal in comparison with the first data signal, and outputting corresponding check results;
a second driver suitable for modifying the delayed first data signal according to a corresponding check result, and driving the second latch according to a first modified delayed signal;
a third driver suitable for modifying the delayed first data signal according to a corresponding check result, and driving the third latch according to a second modified delayed signal; and
a fourth driver suitable for modifying the delayed first data signal according to a corresponding check result, and driving the fourth latch according to a third modified delayed signal.

11. The data interface circuit according to claim 8, further comprising:
a first data buffer suitable for buffering the first data signal, and applying the buffered first data signal to the skew control circuit;
a second data buffer suitable for buffering the second data signal, and applying the buffered second data signal to the skew control circuit;
a third data buffer suitable for buffering the third data signal, and applying the buffered third data signal to the skew control circuit;
a fourth data buffer suitable for buffering the fourth data signal, and applying the buffered fourth data signal to the skew control circuit; and
a data strobe buffer suitable for buffering the data strobe signal, and applying the buffered data strobe signal to the first latch.

12. The data interface circuit according to claim 11, wherein the first data buffer is positioned at a shortest distance from the data strobe buffer.

13. The data interface circuit according to claim 11,
wherein the first data signal to the fourth data signal include data read from a memory cell array, and
wherein the first data to the fourth data include data to be transmitted to a memory controller.

14. The data interface circuit according to claim 11,
wherein the first data signal to the fourth data signal include data received from a memory controller, and
wherein the first data to the fourth data include data to be written in a memory device.

* * * * *